US008467476B2

(12) United States Patent
Lin

(10) Patent No.: US 8,467,476 B2
(45) Date of Patent: Jun. 18, 2013

(54) SCALING APPARATUS OF A RECEIVER

(75) Inventor: Che-Li Lin, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 907 days.

(21) Appl. No.: 11/856,065

(22) Filed: Sep. 17, 2007

(65) Prior Publication Data

US 2009/0074042 A1    Mar. 19, 2009

(51) Int. Cl.
*H03K 9/00* (2006.01)

(52) U.S. Cl.
USPC .......................................................... 375/316

(58) Field of Classification Search
USPC ................. 375/222, 224, 260–261, 279–281, 375/295, 308, 316, 340, 345, 347, 317, 318; 370/57, 69.1, 281, 296, 343, 436, 478, 480, 370/203, 208, 210; 455/132, 134–136, 138, 455/216, 226.1–226.3, 232.1, 234.1, 245.1, 455/250; 330/129, 135
See application file for complete search history.

(56) References Cited

U.S. PATENT DOCUMENTS

| 4,785,352 | A | * | 11/1988 | Burrowes et al. | 348/678 |
| 5,450,453 | A | * | 9/1995 | Frank | 375/130 |
| 5,678,198 | A | * | 10/1997 | Lemson | 455/67.11 |
| 5,758,271 | A | * | 5/1998 | Rich et al. | 455/234.1 |
| 5,875,215 | A | | 2/1999 | Dobrica | |
| 6,049,361 | A | | 4/2000 | Kim | |
| 6,091,298 | A | | 7/2000 | McNicol | |
| 6,489,846 | B2 | | 12/2002 | Hatsugai | |
| 6,507,628 | B1 | | 1/2003 | McCallister | |
| 6,611,794 | B1 | * | 8/2003 | Fleming-Dahl | 702/191 |
| 6,915,084 | B2 | * | 7/2005 | Ho et al. | 398/208 |
| 7,013,089 | B1 | * | 3/2006 | Ho et al. | 398/159 |
| 7,162,163 | B1 | * | 1/2007 | Ho et al. | 398/159 |
| 7,200,194 | B2 | * | 4/2007 | Lin et al. | 375/350 |
| 7,310,369 | B1 | * | 12/2007 | Krieger et al. | 375/227 |
| 7,366,137 | B2 | * | 4/2008 | Abrishamkar et al. | 370/332 |
| 2002/0012403 | A1 | * | 1/2002 | McGowan et al. | 375/295 |
| 2002/0156822 | A1 | * | 10/2002 | Tanai | 708/404 |
| 2003/0045318 | A1 | * | 3/2003 | Subrahmanya | 455/522 |
| 2003/0139160 | A1 | * | 7/2003 | Yang | 455/226.1 |
| 2003/0142659 | A1 | | 7/2003 | Lin et al. | |
| 2004/0042802 | A1 | * | 3/2004 | Ho et al. | 398/208 |
| 2004/0092238 | A1 | * | 5/2004 | Filipovic | 455/131 |
| 2004/0203430 | A1 | * | 10/2004 | Morris | 455/67.11 |
| 2004/0240419 | A1 | * | 12/2004 | Abrishamkar et al. | 370/342 |
| 2005/0163199 | A1 | * | 7/2005 | Wang | 375/148 |
| 2006/0067444 | A1 | * | 3/2006 | Hamamoto | 375/347 |
| 2006/0176985 | A1 | * | 8/2006 | Tandon et al. | 375/345 |
| 2007/0211815 | A1 | * | 9/2007 | Pan et al. | 375/267 |
| 2008/0008228 | A1 | * | 1/2008 | Cedergren et al. | 375/147 |
| 2010/0120467 | A1 | * | 5/2010 | Auranen et al. | 455/552.1 |

* cited by examiner

*Primary Examiner* — Tesfaldet Bocure
(74) *Attorney, Agent, or Firm* — Winston Hsu; Scott Margo

(57) ABSTRACT

A scaling apparatus set in a receiver is disclosed. The receiver includes a symbol-processing unit. The scaling apparatus includes a calculating unit and a scaling unit. The calculating unit estimates the signal strength of an input symbol and generates a scaling factor accordingly. The scaling unit scales an output symbol outputted from the symbol-processing unit according to the scaling factor. The output symbol is generated from the symbol-processing unit through processing the input symbol.

13 Claims, 4 Drawing Sheets

SCALING APPARATUS OF A RECEIVER

BACKGROUND

The embodiments relate to receivers. More particularly, the embodiments relate to scaling apparatuses, which operate in a symbol-by-symbol manner and are set in an OFDM receiver.

A receiver comprises a variable gain amplifier that adjusts the amplitude of a received signal before the received signal is fed into an analog-to-digital converter (ADC). If the received signal enters the ADC with too large amplitude, saturation will occur, causing the output of the ADC to be distorted. If, on the other hand, the received signal enters the ADC with insufficient amplitude, the signal-to-noise ratio (SNR) will become lower and the performance of the receiver will be deteriorated. Generally speaking, the process of using a control signal to adjust the gain of the variable gain amplifier is called Automatic Gain Control (AGC). Normally, the AGC process is a feed back control process. The feed back control process involves measuring the amplitude of an output signal of the variable gain amplifier, comparing the measured value with a desired value to generate a control signal, and controlling the gain of the variable gain amplifier according to the control signal. Ideally, after performing the AGC process, the amplitude of the received signal to be fed into the ADC will lie in an appropriate range suitable for the ADC.

After the ADC converts the received signal into digital domain, some interference caused by adjacent frequency bands will still exist in the digital signal. A filter is therefore required to sift out the unwelcome signal components; however, the filter also causes the desired signal to become smaller. A common solution to this problem is to set a digital AGC at the output end of the filter. The digital AGC adjusts the amplitude of the filtered signal so that the following digital signal processing procedures can be facilitated.

Some typical receivers, however, such as orthogonal frequency division multiplexing (OFDM) receivers, sometimes have to receive signals while the receiver or transmitter moves at a high speed. The channel condition between the transmitter and the receiver may change rapidly when the receiver or the transmitter is moving at a high speed. Performing the AGC process and the digital AGC process may not be sufficient for adjusting the amplitude of the signal within the preferred range in such a rapid changing channel. The performance of the receiver is therefore deteriorated when the receiver is moving at a high speed.

SUMMARY

According to one exemplary embodiment, a scaling apparatus set in a receiver (e.g., an OFDM receiver) is provided. The scaling apparatus has a calculating unit, a delay unit, and a scaling unit. The calculating unit estimates the signal strength of a received symbol and generates a scaling factor accordingly. The delay unit delays the received symbol. The scaling unit scales the received symbol outputted by the delay unit according to the scaling factor.

According to another exemplary embodiment, a scaling apparatus set in a receiver (e.g., an OFDM receiver) is provided. The receiver has a symbol-processing unit. The scaling apparatus includes a calculating unit and a scaling unit. The calculating unit estimates the signal strength of an input symbol and generates a scaling factor accordingly. The scaling unit scales an output symbol outputted from the symbol-processing unit according to the scaling factor. The output symbol is generated from the symbol-processing unit through processing the input symbol.

DETAILED DESCRIPTION

Figure 1:
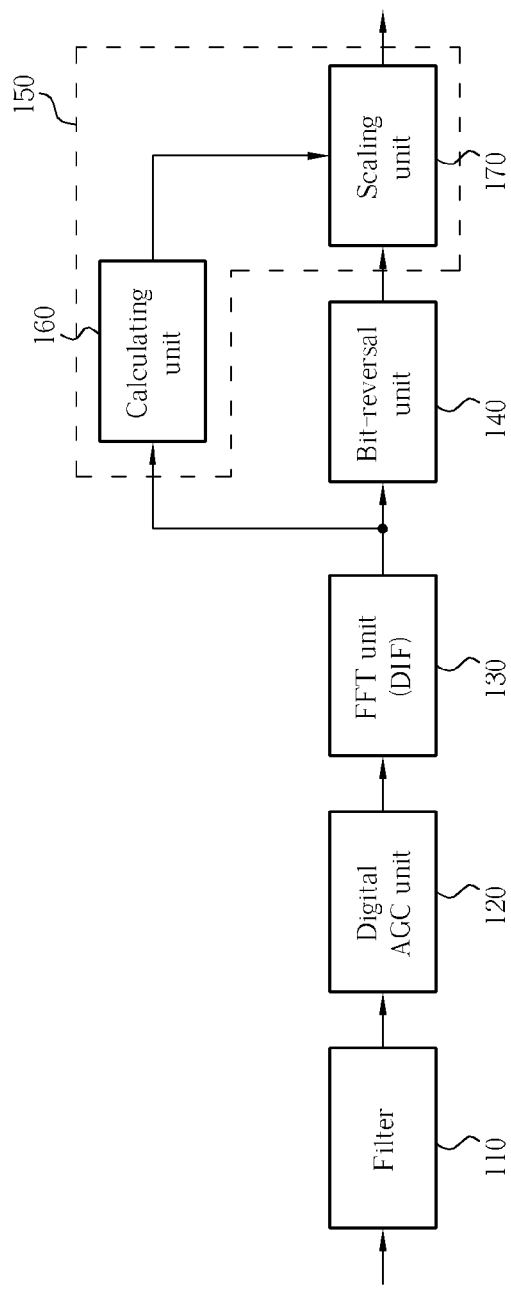
FIG. 1 shows a scaling apparatus set in a receiver according to a first embodiment.

FIG. 1 shows a scaling apparatus set in a receiver according to a first embodiment. Herein an example of the receiver is an OFDM receiver applying Decimation in Frequency (DIF) Fast Fourier Transform (FFT) scheme. The OFDM receiver includes a filter 110, a digital AGC unit 120, an FFT unit 130, and a bit reversal unit 140. The FFT unit 130 generates a frequency domain disorderly symbol with a plurality of sub-carriers, in which the output sub-carriers are not arranged in a sequence corresponding to successive sub-carrier frequencies, according to a time domain symbol received from the digital AGC unit 120. For each disorderly symbol, the bit reversal unit 140 rearranges the order of sub-carriers in the disorderly symbol so as to generate an orderly symbol. The operation of the bit reversal unit 140 requires a memory space that is equal to or larger than the OFDM FFT size and causes a delay of an OFDM symbol time to occur. The scaling apparatus 150 of this embodiment is a per-symbol scaling apparatus that operates in a symbol-by-symbol manner. The scaling apparatus 150 has a calculating unit 160 and a scaling unit 170. While the bit reversal unit 140 processes disorderly symbol to generate a corresponding orderly symbol, the calculating unit 160 takes advantage of the delay time caused by the bit reversal unit 140 to estimate the signal strength of the currently processed disorderly symbol and to generate a scaling factor accordingly. The scaling unit 170 then utilizes the scaling factor to adjust the amplitude of the orderly symbol, which is generated by the bit reversal unit 140 through processing the disorderly symbol. In other words, the amplitude of an orderly symbol, which is generated through processing a disorderly symbol, is adjusted according to a scaling factor that is generated through estimating the signal strength of the disorderly symbol. The scaling apparatus of this embodiment is therefore referred to as a per-symbol scaling apparatus that operates in a symbol-by-symbol manner.

To estimate the signal strength of frequency domain symbol, the calculating unit 160 sums at least one of a plurality of strength factors to generate an estimation value, and compares the estimation value with a threshold value to generate the scaling factor. The threshold value, which represents desired amplitude of the disorderly symbol for facilitating the following digital signal processing procedures, is a value that can be determined beforehand. Each of the strength factors corresponds to the strength of one of a plurality of selected sub-carriers in the disorderly symbol. For example, the selected sub-carriers may include at least one, some or all of the sub-carriers in the disorderly symbol, or at least one, some or all of the pilot sub-carriers in the disorderly symbol. Since each sub-carrier is a complex value, the amplitude of the complex value can be utilized as the strength factor representing the strength of the selected sub-carrier. Please note that other metric of the selected sub-carrier can also be utilized as the strength factor representing the strength of the selected sub-carrier.

Figure 2:
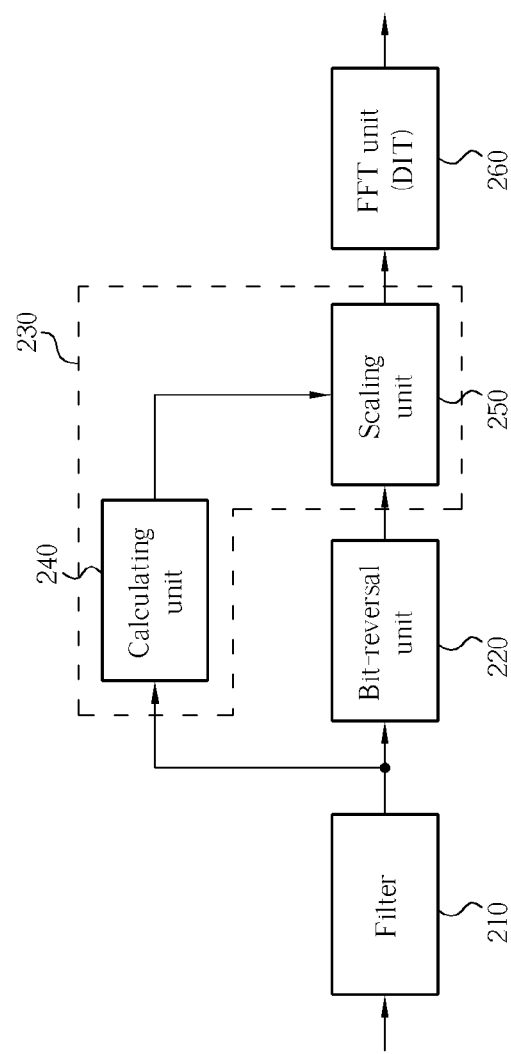
FIG. 2 shows a scaling apparatus set in a receiver according to a second embodiment.

FIG. 2 shows a scaling apparatus set in a receiver according to a second embodiment. Herein an example of the receiver is an OFDM receiver applying Decimation in Time (DIT) Fast Fourier Transform (FFT) scheme. The OFDM receiver includes a filter 210, a bit reversal unit 220 and an FFT unit 260. A plurality of orderly symbols, each of which is a time domain symbol and includes a plurality of time domain data samples, constitutes the input of the bit reversal unit 220. For each of the orderly symbols, the bit reversal unit 220 rearranges the order of the data samples contained therein to generate a corresponding disorderly symbol. The amplitude of the disorderly symbols generated by the bit reversal unit 220 is adjusted by the scaling apparatus 230 in a symbol-by-symbol manner and then fed into the FFT unit 260. The operation of the bit reversal unit 220 requires a memory space that is equal to or larger than the OFDM FFT size and causes a delay of an OFDM symbol time to occur. The scaling apparatus 230 of this embodiment has a calculating unit 240 and a scaling unit 250. While the bit reversal unit 220 processes an orderly symbol to generate a corresponding disorderly symbol, the calculating unit 240 takes advantage of the delay time caused by the bit reversal unit 220 to estimate the signal strength of the currently processed orderly symbol and to generate a scaling factor accordingly. The scaling unit 250 then utilizes the scaling factor to adjust the amplitude of the disorderly symbol, which is generated by the bit reversal unit 220 through processing the orderly symbol. In other words, the amplitude of a disorderly symbol, generated through processing an orderly symbol, is adjusted according to a scaling factor that is generated through estimating the signal strength of the orderly symbol. The scaling apparatus 230 of this embodiment is therefore referred to as a per-symbol scaling apparatus that operates in a symbol-by-symbol manner.

To estimate the signal strength of time domain symbol, the calculating unit 240 sums at least one of a plurality of strength factors to generate an estimation value, and compares the estimation value with a threshold value to generate the scaling factor. The threshold value, which represents desired amplitude of the orderly symbol for facilitating the following digital signal processing procedures, is a value that can be determined beforehand. Each of the strength factors corresponds to the strength of one of a plurality of selected data samples in the orderly symbol. For example, the selected data samples may include at least one, some or all of the data samples in the orderly symbol. Since each data sample is a complex value, the amplitude of the complex value of a selected data sample can be utilized as the strength factor representing the strength of the selected data sample. Please note that other metric of the selected data sample can also be utilized as the strength factor representing the strength of the selected data sample.

Since the scaling apparatus 230 adjusts the amplitude of the disorderly symbols before they are fed into the FFT unit 260, the OFDM receiver of this embodiment does not have to include a digital AGC unit. Hardware cost of the OFDM receiver is therefore reduced.

Figure 3:
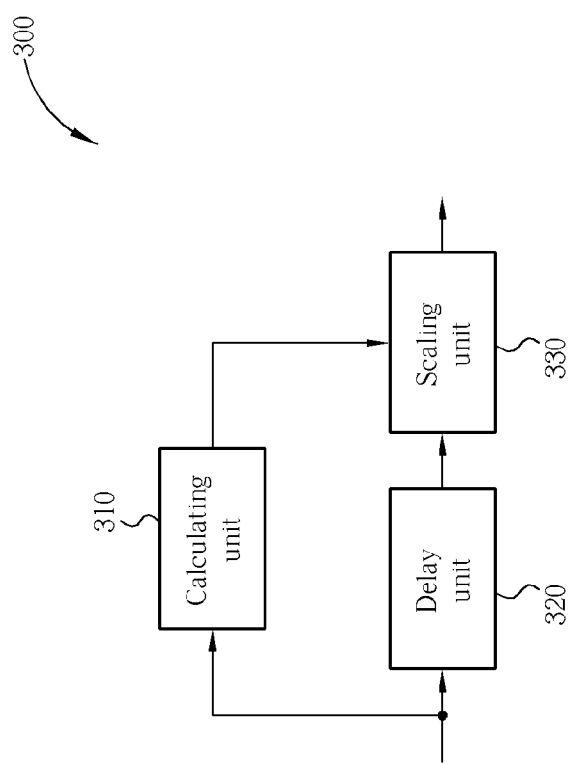
FIG. 3 shows a scaling apparatus set in a receiver according to a third embodiment.

FIG. 3 shows a scaling apparatus, which includes a calculating unit 310, a delay unit 320, and a scaling unit 330, set in a receiver according to a third embodiment. Herein an example of the receiver is an OFDM receiver, which includes an FFT unit and a bit reversal unit.

If the OFDM receiver applies Decimation in Frequency (DIF) Fast Fourier Transform (FFT) scheme, the bit reversal unit is a back-end component of the FFT unit. The scaling apparatus 300 can be set as a front-end component of the FFT unit or a back-end component of the bit reversal unit. Alternatively, the scaling apparatus 300 can also be set between the FFT unit and the bit reversal unit.

If the OFDM receiver applies Decimation in Time (DIT) Fast Fourier Transform (FFT) scheme, the bit reversal unit is a front-end component of the FFT unit. The scaling apparatus 300 can be set as a front-end component of the bit reversal unit or a back-end component of the FFT unit. Alternatively, the scaling apparatus 300 can also be set between the bit reversal unit and the FFT unit.

A plurality of symbols, which are time domain symbols or frequency domain symbols, constitute the input of the calculating unit 310 and the delay unit 320. For each of the symbols, the calculating unit 310 estimates the signal strength of the input symbol to generate a scaling factor accordingly. The scaling unit 330 then adjusts the amplitude of the symbol received from the delay unit 320 according to the scaling factor. For each symbol received, the delay unit 320 delays the symbol while the calculating unit 310 estimates the signal strength of the symbol. In other words, the delay unit 320 ensures that, for the scaling unit 330, the arrival timing of the symbol can coincide with the arrival timing of the corresponding scaling factor. The delay unit 320 therefore ensures that the scaling unit 330 adjusts the amplitude of a symbol with a scaling factor that is determined according to the symbol. The scaling apparatus 300 of this embodiment is therefore referred to as a per-symbol scaling apparatus that operates in a symbol-by-symbol manner.

To estimate the signal strength of the frequency domain symbol or the time domain symbol, the calculating unit 310 sums at least one of the plurality of strength factors to generate an estimation value, and compares the estimation value with a threshold value to generate a scaling factor. The details of the estimation value and the threshold value have been described in previous paragraphs and will not be described in more detail for the sake of brevity.

Figure 4:
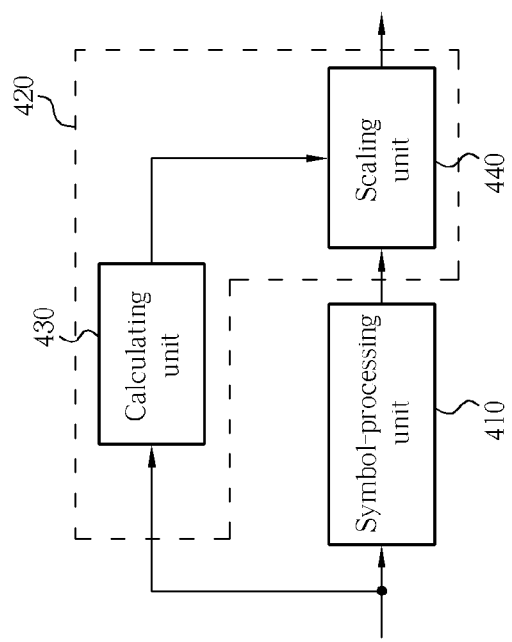
FIG. 4 shows a scaling apparatus set in a receiver according to a fourth embodiment.

FIG. 4 shows a scaling apparatus set in a receiver according to a fourth embodiment. Herein an example of the receiver is an OFDM receiver, which includes a symbol-processing unit 410. A plurality of input symbols constitutes the input of the symbol-processing unit 410. The symbol-processing unit 410 processes each input symbol to generate a corresponding output symbol. Thus the symbol-processing unit 410 causes a delay time during the processing. Therefore, for any symbol-processing unit which may introduce a delay time during the processing procedure can be an embodiment of the invention. For example, if the OFDM receiver applies a Decimation in Frequency (DIF) Fast Fourier Transform (FFT) scheme, the symbol-processing unit 410 can be implemented by an FFT unit (DIF) or a bit reversal unit of the OFDM receiver, or be implemented by both the FFT unit (DIF) and the bit reversal unit of the OFDM receiver. If the OFDM receiver applies a Decimation in Time (DIT) Fast Fourier Transform (FFT) scheme, the symbol-processing unit 410 can be implemented by a bit reversal unit or an FFT unit (DIT) of the OFDM receiver, or can be implemented by both the bit reversal unit and the FFT unit (DIT) of the OFDM receiver.

The scaling apparatus 420 of this embodiment includes a calculating unit 430 and a scaling unit 440. While the symbol-processing unit 410 processes input symbol to generate a corresponding output symbol, the calculating unit 430 takes advantage of the delay time caused by the symbol-processing unit 410 to estimate the signal strength of the input symbol and to generate a scaling factor accordingly. The scaling unit 440 then utilizes the scaling factor to adjust the amplitude of the output symbol, which is generated by the symbol-processing unit 410 through processing the input symbol. In other words, the amplitude of an output symbol, generated through processing an input symbol, is adjusted according to a scaling factor that is generated through estimating the signal strength of the input symbol. The scaling apparatus 420 of this embodiment is therefore referred to as a per-symbol scaling apparatus that operates in a symbol-by-symbol manner.

To estimate the signal strength of the input time domain symbol or the input frequency domain symbol, the calculating unit 430 sums a plurality of strength factors to generate an estimation value, and compares the estimation value with a threshold value to generate a scaling factor. The details of the estimation value and the threshold value have been described in previous paragraphs and will not be described in more detail for the sake of brevity.

The disclosed invention differs from the AGC scheme and digital AGC scheme, applied by the related arts, by utilizing a feed forward control scheme that adjusts symbol amplitude in a symbol-by-symbol manner. More specifically, in the AGC scheme or digital AGC scheme applied by the related arts, a gain determined according to the currently received signal will be utilized later to adjust the follow-up signal, rather than be utilized later to adjust the currently received signal. In the embodiments a scaling factor determined according to a particular symbol is utilized to adjust the amplitude of either the particular symbol or the symbol generated from the particular symbol. In other words, scaling factors that are mutually independent are utilized to scale different symbols. With the per-symbol, feed forward control scheme proposed by the embodiments, even when the condition of the communication channel(s) utilized by a receiver changes swiftly, the performance of the receiver can still be maintained.

What is claimed is:

1. A scaling apparatus set in a receiver, the scaling apparatus comprising:
    a calculating unit, for estimating the signal strength of a received symbol and generating a scaling factor accordingly;
    a delay unit for delaying the received symbol; and
    a scaling unit, coupled to the calculating unit and the delay unit, for scaling the received symbol outputted by the delay unit according to the scaling factor;
    wherein the received symbol is a frequency domain symbol; the calculating unit sums at least one of a plurality of strength factors to generate an estimation value, and compares the estimation value with a threshold value to generate the scaling factor; and the strength factors correspond to the amplitude of a plurality of selected sub-carriers in the received symbol.

2. The scaling apparatus of claim 1, wherein the selected sub-carriers comprise pilot sub-carriers in the received symbol.

3. The scaling apparatus of claim 1, wherein the calculating unit estimates the signal strength of the received symbol while the delay unit is delaying the received symbol.

4. The scaling apparatus of claim 1, wherein an input of the calculating unit is directly connected to an input of the delay unit.

5. A scaling apparatus set in a receiver, the scaling apparatus comprising:
    a calculating unit, for estimating the signal strength of a received symbol and generating a scaling factor accordingly;
    a delay unit for delaying the received symbol; and
    a scaling unit, coupled to the calculating unit and the delay unit, for scaling the received symbol outputted by the delay unit according to the scaling factor;
    wherein the received symbol is a time domain symbol; the calculating unit sums at least one of a plurality of strength factors to generate an estimation value, and compares the estimation value with a threshold value to generate the scaling factor; and the strength factors correspond to the amplitude of a plurality of selected data samples in the symbol.

6. A scaling apparatus set in a receiver, the receiver comprising a symbol-processing unit, the scaling apparatus comprising:
    a calculating unit, for estimating the signal strength of an input symbol and generating a scaling factor accordingly; and
    a scaling unit, coupled to the calculating unit and the symbol-processing unit, for scaling an output symbol outputted from the symbol-processing unit according to the scaling factor;
    wherein the output symbol is generated from the symbol-processing unit through processing the input symbol; the input symbol is a frequency domain symbol; the calculating unit sums at least one of a plurality of strength factors to generate an estimation value, and compares the estimation value with a threshold value to generate the scaling factor; and the strength factors correspond to the amplitude of a plurality of selected sub-carriers in the input symbol.

7. The scaling apparatus of claim 6, wherein the selected sub-carriers comprise pilot sub-carriers in the input symbol.

8. The scaling apparatus of claim 6, wherein the calculating unit estimates the signal strength of the input symbol while the symbol-processing unit is processing the input symbol.

9. The scaling apparatus of claim 6, wherein an input of the calculating unit is directly connected to an input of the symbol-processing unit.

10. A scaling apparatus set in a receiver, the receiver comprising a symbol-processing unit, the scaling apparatus comprising:
    a calculating unit, for estimating the signal strength of an input symbol and generating a scaling factor accordingly; and
    a scaling unit, coupled to the calculating unit and the symbol-processing unit, for scaling an output symbol outputted from the symbol-processing unit according to the scaling factor;
    wherein the output symbol is generated from the symbol-processing unit through processing the input symbol; and the symbol-processing unit comprises a bit reversal unit for rearranging a disorderly input symbol to generate an orderly output symbol.

11. The scaling apparatus of claim 10, wherein the symbol-processing unit further comprises an FFT unit coupled to the bit reversal unit for transferring a data symbol in time domain to generate the disorderly input symbol in frequency domain.

12. A scaling apparatus set in a receiver, the receiver comprising a symbol-processing unit, the scaling apparatus comprising:
    a calculating unit, for estimating the signal strength of an input symbol and generating a scaling factor accordingly; and
    a scaling unit, coupled to the calculating unit and the symbol-processing unit, for scaling an output symbol outputted from the symbol-processing unit according to the scaling factor;
    wherein the output symbol is generated from the symbol-processing unit through processing the input symbol; the input symbol is a time domain symbol; the calculating unit sums at least one of a plurality of strength factors to generate an estimation value, and compares the estimation value with a threshold value to generate the scaling factor; and the strength factors correspond to the amplitude of a plurality of selected data samples in the input symbol.

13. A scaling apparatus set in a receiver, the receiver comprising a symbol-processing unit, the scaling apparatus comprising:
- a calculating unit, for estimating the signal strength of an input symbol and generating a scaling factor accordingly; and
- a scaling unit, coupled to the calculating unit and the symbol-processing unit, for scaling an output symbol outputted from the symbol-processing unit according to the scaling factor;
- wherein the output symbol is generated from the symbol-processing unit through processing the input symbol; and the symbol-processing unit comprises a bit reversal unit for rearranging an orderly input symbol to generate a disorderly output symbol.

* * * * *